United States Patent [19]

Cini et al.

[11] Patent Number: 4,727,465
[45] Date of Patent: Feb. 23, 1988

[54] DRIVE CIRCUIT FOR N-CHANNEL POWER MOS TRANSISTORS OF PUSH-PULL STAGES

[75] Inventors: Carlo Cini, Cornaredo; Claudio Diazzi, Milan; Domenico Rossi, Cilavegna, all of Italy

[73] Assignee: SGS Microelettronica S.p.A., Catania, Italy

[21] Appl. No.: 897,467

[22] Filed: Aug. 18, 1986

[30] Foreign Application Priority Data

Sep. 10, 1985 [IT] Italy ................. 22105 A/85

[51] Int. Cl.$^4$ ........................................ H02M 3/335
[52] U.S. Cl. ...................................... 363/24; 363/134
[58] Field of Search ................... 363/24, 25, 26, 56, 363/133, 134

[56] References Cited

U.S. PATENT DOCUMENTS 4,550,359 10/1985 West ...................................... 363/134

Primary Examiner—Patrick R. Salce
Assistant Examiner—Judson H. Jones
Attorney, Agent, or Firm—Albert Josif; Guido Modiano

[57] ABSTRACT

This circuit, for reliably driving a load both in DC and AC mode with a low dissipation, comprises a pair of MOS power transistors, in a push-pull configuration, and a bootstrap circuit including a bootstrap capacitor placed between the source of the upper MOS transistor and a reference voltage point, through a first switch. A second switch is arranged between the supply line and the gate of the upper MOS transistor, while a third switch is arranged between the gate of the upper MOS transistor and the point common to the first switch and the bootstrap capacitor. During DC operation, the switches are open or closed in order to allow for the connection of the gate of the MOS power transistor to the supply voltage. During AC operation, the switches are controlled thereby, alternately the capacitor is charged at the voltage of the reference voltage point and the upper MOS transistor is held at a gate-to-source voltage sufficient to feed the load.

10 Claims, 7 Drawing Figures

DRIVE CIRCUIT FOR N-CHANNEL POWER MOS TRANSISTORS OF PUSH-PULL STAGES

BACKGROUND OF THE INVENTION

The present invention relates to a driving circuit for N-channel power MOS transistors of push-pull stages.

As is known, in push-pull stages made with N-channel MOS technology, the upper device requires a gate voltage higher than the supply in order to reach a high-conductivity state. For this purpose, a bootstrap circuit is employed, which allows to obtain the required voltage.

A known circuit of this kind is illustrated, for clarity, in FIG. 1 showing a MOS power transistor 1, which constitutes the lower device, a MOS power transistor 2, which constitutes the upper device, an input 3 for the signal and a load 4 connected with a terminal to the common point of the transistors 1 and 2. The circuit furthermore comprises a bootstrap capacitor 5 connected with its terminals between the source S of the transistor 2 and the gate G of the latter through the circuit comprising the transistor 6, the current source 7, the diode 8, and the MOS transistor 9. Furthermore, a diode 10 is provided, being connected with its anode to the supply voltage $V_{CC}$ and with its cathode to the rest of the circuit.

In DC operation, the gate of the transistor 2 is connected to the supply voltage through the bootstrap circuit. Consequently the load can be fed even if at a voltage lower than the (positive) supply. As an example, if the supply voltage $V_{CC}$ is 30 V, on the load it is possible to obtain a voltage of 20 V, given as a first approximation by the difference between the supply voltage and the gate to source drop ($V_{GS}$). In such conditions, the power transistor operates open and dissipates high power, through it is capable of feeding the load. In AC operation, however, it is disadvantageous to have the bootstrap system apply to the gate of the power transistor, with respect to the source, a voltage equal to the supply voltage. Such a voltage value is too high, since, in order to have a good driving, it is necessary to apply a voltage $V_{GS}$ comprised between approximately 10 and 14 V, while voltages higher than 20 V can be dangerous for the MOS power transistor itself.

In order to solve the above described AC operation problem, it is possible to supply the bootstrap circuit at a lower voltage, as an example 12 V. Such a solution is shown, as an example, in FIG. 2, in which the same elements of FIG. 1 have been designated with the same reference numeral. In particular, as can be noted, the circuit of FIG. 2 is different from the one of FIG. 1 only for the fact that the anode of the diode 10 is no longer connected to the voltage supply $V_{CC}$, but is fixed to a suitable lower constant voltage (e.g. 12 V).

The configuration shown in FIG. 2 does indeed solve the AC operation problem, by virtue of the connection of the gate of the transistor 2 to a lower voltage, but it is no longer capable of giving power to the DC lead. Indeed, the MOS transistor 2, in order to conduct current, needs a voltage drop $V_{GS}$ of approximately 10 V. Since, during DC operation, the gate circuit is fed at low voltage (in the example shown, at 12 V), it has not a voltage sufficient to supply the load, and the circuit shown is not capable of operating in direct current.

In order to solve the problems presented by the circuits shown in FIGS. 1 and 2, that is to say, in order to obtain a circuit capable of reliable DC and AC operating, a solution such as the one shown in FIG. 3 has been studied by the Applicants. Such a circuit (in which the elements equal to the preceding circuits have been indicated with the same reference numerals) is different from the preceding ones due to the fact that between the bootstrap circuit and the supply voltage $V_{CC}$ two zener diodes 11' and 11" are arranged which have for example a break down voltage at 7 V and are series coupled in order to hold, together, 14 V. Such a circuit is capable of operating reliably both in the DC mode, in which the gate circuit of the transistor 2 is connected to the supply voltage $V_{CC}$ by means of the two diodes, and is therefore capable of applying sufficient power to the load, and in the AC mode, since, when the device goes in bootstrap, the diodes break at 14 V, so that the drop $V_{GS}$ remains locked at this value.

Such a device, however, has the disadvantage of absorbing high power for its operation, without this power being usable or transferred to the load. Indeed, at every operating cycle, the capacitor 5 charges to the supply voltage $V_{CC}$ and then, during the bootstrap phase, discharges the excess voltage on the two zener diodes 11' and 11" which lock the voltage to the preset value. Consequently, at each cycle power is taken for charging the capacitor, which energy is then dissipated in the discharge of the capacitor through the zeners 11' and 11". Consequently, the circuit of FIG. 3, though it solves the problem of adequately supplying the load in the DC mode and of ensuring the AC operation, has the disadvantage of being too dissipative, which causes its use to be impossible or anyhow disadvantageous in most cases.

SUMMARY OF THE INVENTION

Accordingly, the aim of the present invention consists of providing a circuit for driving MOS power transistors of push-pull stages, capable of solving the disadvantages shown by the prior art.

A particular object of the present invention is to provide a driving circuit, capable of adequately supplying a load in the DC mode, of operating reliably in the AC mode, and such as to have a low dissipation during operation.

Another object of the present invention is to provide a driving circuit, capable of operating with low dissipation both in the DC and in AC mode.

Not last object of the present invention is to provide a driving circuit comprising conceptually simple elements, which can be integrated in a single structure, according to already known technologies, so as to have low manufacturing costs.

The above aim and objects as well as others which will better appear hereinafter are achieved by a driving circuit for power MOS transistors of push-pull stages, comprising a first power MOS transistor and a second power MOS transistor, said MOS transistors being connected in a push-pull configuration and defining an upper and a lower MOS transistor, respectively; an AC signal input connected to gate electrodes of said first and second MOS transistors; and a bootstrap circuit having a bootstrap capacitor applied between a source electrode of said upper MOS transistor and a reference voltage point through a first switch element, said upper MOS transistor being connected with a drain electrode thereof at a supply voltage, characterized in that it comprises a second switch element arranged between said supply voltage and the gate electrode of said upper MOS transistor and a third switch element arranged between said gate electrode of said upper MOS transistor and a common point defined by said first switch and said capacitor, said second switch element being closed and said first and third switch element being open during DC operation, thereby allowing electrical connection of said gate electrode of said upper MOS transistor to said supply voltage, said first and second switch elements being closed and said third switch element being open during AC operation with an input signal at said AC signal input at a first level, thereby said capacitor charging at the voltage of said reference voltage point, said first and second switch elements being open and said third switch element being closed during AC operation with said AC signal at said AC signal input at a second level.

BRIEF DESCRIPTION OF THE DRAWINGS

Further features and advantages will become better apparent from the description of a preferred, but not exclusive, embodiment, given by way of non-limitative example in the accompanying drawings, where.

DESCRIPTION OF THE PREFERRED EMBODIMENT

Figure 1:
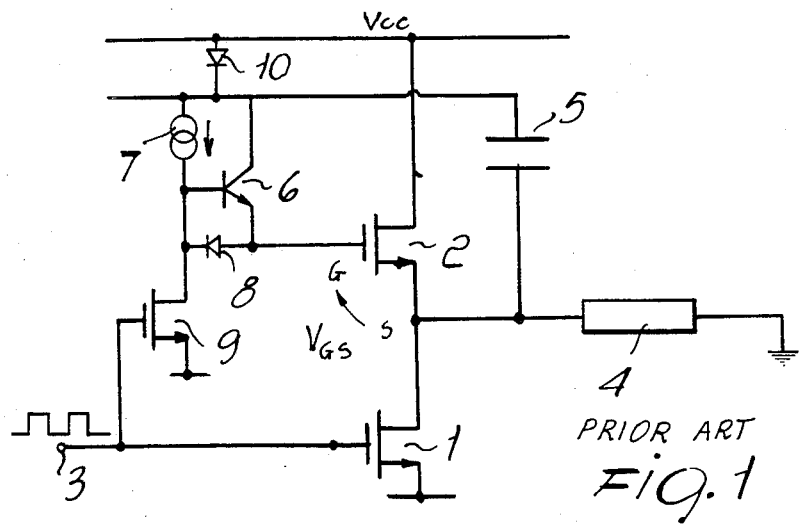
FIGS. 1 to 3 are equivalent electric diagrams of prior or possible embodiments of drive circuits for power MOS's of push-pull stages.
Figure 2:
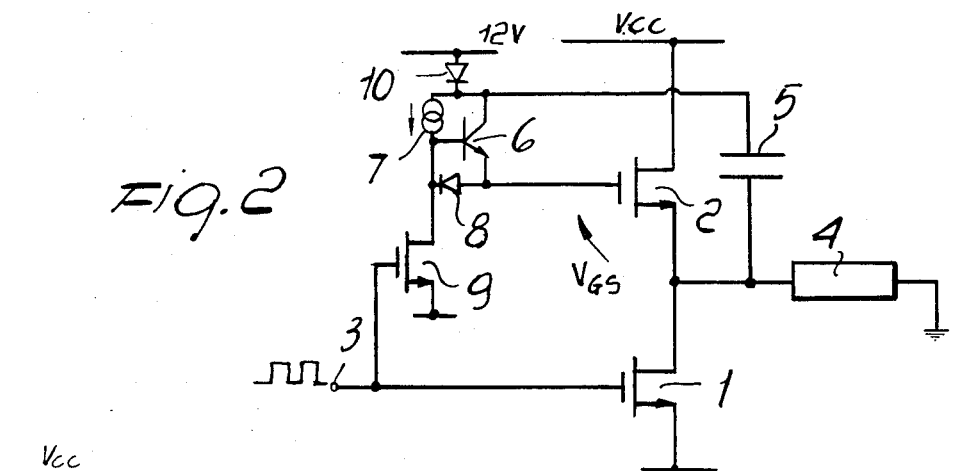
Figure 3:
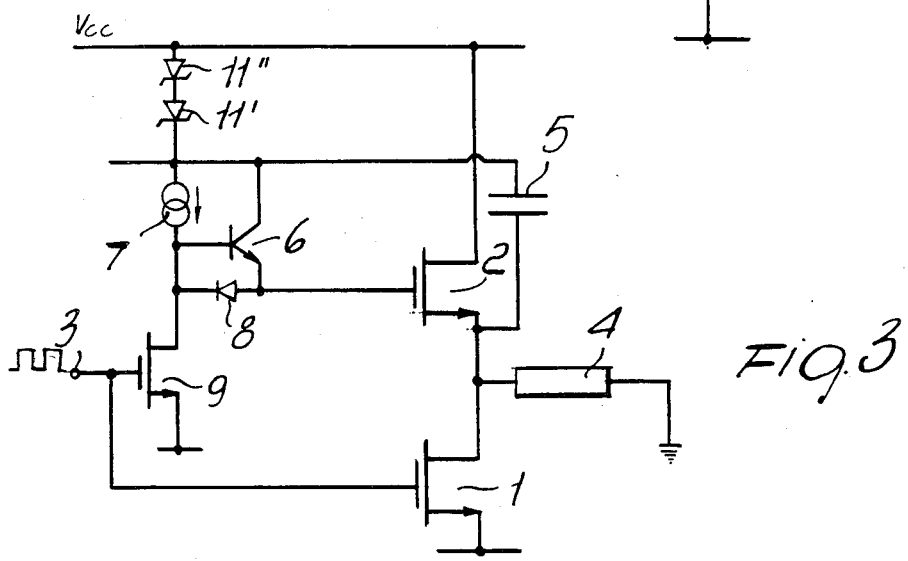

Hereinafter, FIGS. 1 to 3, already explained in detail in the introductory part of the present description, will not be described.

Figure 4:
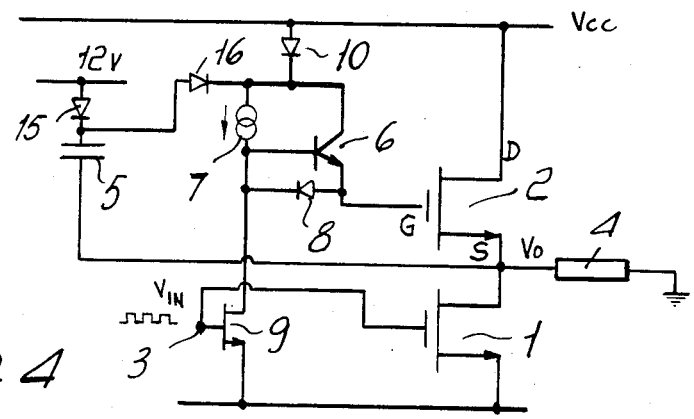
FIG. 4 is an equivalent electric diagram of the device according to the invention.

With reference to FIG. 4, it shows the electric diagram of the circuit according to the invention. The circuit comprises some components equal to the embodiment of FIG. 1, so that said components have the same reference numerals. The device according to the invention, therefore, is composed of a pair of N-channel MOS transistors 1 and 2, fed with the input signal through the terminal 3, and driving a load 4. The circuit furthermore comprises a bootstrap capacitor 5, the transistor 6, the current source 7, the diode 8 as well as a MOS transistor 9 as in the preceding embodiments. Similarly to FIG. 1, a diode 10 is placed between the bootstrap circuit and the supply $V_{CC}$. According to the invention, the driving circuit of the MOS transistors comprises a pair of diodes 15 and 16, suitably connecting a further DC source (e.g. 12 V) with the bootstrap circuit. In detail, the diode 15 is connected with its anode at such constant voltage (12 V) and with its cathode to one of the terminals of the capacitor 5, while the diode 16 is connected with its anode to the cathode of the diode 15 and with its cathode to the bootstrap circuit, comprising the transistor 6, the source 7 and the diode 8. The diodes 15 and 16, together with the diode 10, operate as switches and switch on or off depending on the operating mode of the circuit, so as to allow the connection of the gate of the transistor 2 to the supply $V_{CC}$ or keep a preset drop between the gate and the source of the transistor 2 during AC operation.

In detail, the operation of the circuit according to the invention is as follows.

During DC operation with $V_{IN}$ in its low state, the diode 10 is directly biased, while the diodes 15 and 16 are inversely biased. Consequently, the gate of the transistor 2 is directly connected to the supply voltage $V_{CC}$ through the diode 10 and the gate circuit, so that it is possible to feed the load with power, and therefore the load is controlled appropriately.

In AC operation, when the input signal $V_{IN}$ becomes high, the capacitor 5 charges to approximately 12 V. In fact, the lower MOS transistor 1 is in the ON state through the diode 15 which is ON, whereas the diode 16 is still OFF and de-couples the diode 10 (which is ON) from the diode 15. In the subsequent phase, when the input signal $V_{IN}$ becomes low, as the output voltage $V_O$ increases, the diode 10 gets OFF, while the diode 16 is directly biased and therefore supplies the gate circuit of the transistor 2, connecting it to the bootstrap capacitor 5. Consequently, the capacitor 5, charged and having a 12 V voltage drop at its terminals, rises in voltage and therefore inversely biases the diode 15, which therefore turns off. In this manner the capacitor 5 remains charged at the direct voltage at the lower value (in this case, 12 V) and the driving circuit only needs to restore its charge lost in charging the gate of the MOS transistor 2. Consequently, the circuit does not dissipate power on the driving circuit, as would occur in the circuit according to FIG. 3.

The circuit shown in FIG. 4 therefore has an improved AC behavior, with a low power dissipation. However, in this circuit, DC operation with a low-dissipation state of the power MOS transistor 2 is not ensured. Indeed, for a low-dissipation DC operation it is necessary for the drive circuit to supply a DC gate voltage to the power transistor 2 approximately 10 V higher than the supply voltage.

Figure 5:
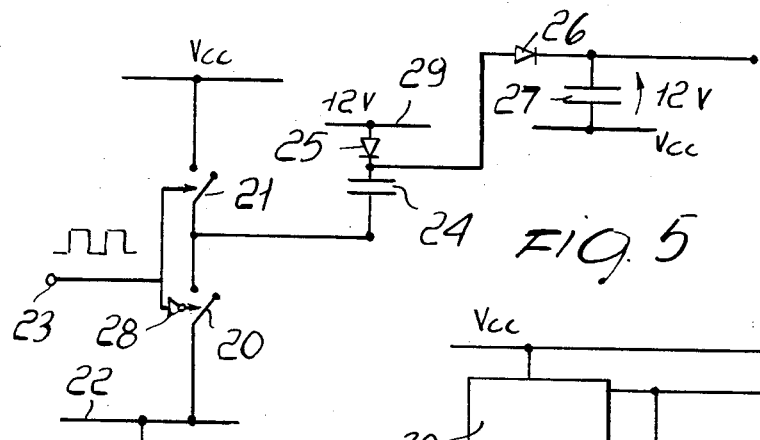
FIG. 5 is a circuit for driving the device according to the invention for DC operation.
Figure 6:
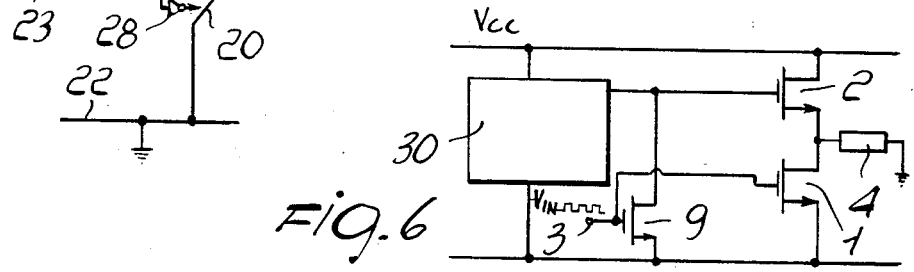
FIG. 6 is a bloc diagram related to the device according to FIG. 5.

In order to improve the behavior of the circuit according to FIG. 4 as far as DC dissipation is concerned, a charge pump may be provided, suitable for maintaining an appropriate voltage on the gate of the transistor 2. In FIGS. 5 and 6 is indeed shown a possible embodiment of said charge pump and the connection thereof with the remaining circuit. In detail, the charge pump, indicated generally at 30 in FIG. 6, is composed of a pair of switches 20 and 21 placed between the DC supply $V_{CC}$ and the ground 22, and controlled as to opening and closing by an oscillating signal (as an example, with a frequency of 500 kHz) supplied on the terminal 23. The control signal applied to the switches 20 and 21 is suitably phase-shifted of 180° so that when one switch is open the other is closed and vice versa. Such a phase opposition is obtained, as an example, by means of a logical inverter 28. The circuit furthermore comprises a capacitor 24 connected with a terminal to a point intermediate to the two switches 20 and 21, and with its other terminal to a DC supply voltage (e.g. 12 V) through a diode 25. A further diode 26 is connected with its anode to the connection point between the cathode of the diode 25 and the capacitor 24 and with its cathode to a further capacitor 27 which with its other terminal is connected to the supply voltage $V_{CC}$.

The circuit of FIG. 5 operates as follows. The capacitor 27 is maintained at a voltage level which is approximately equal to 12 V (i.e. the voltage on line 29), by virtue of the capacitor 24 which, through the pair of switches 20 and 21 and the diode 25, is continually charged to a 12 V voltage at a frequency of 500 kHz and therefore restores at every cycle the charge lost by the capacitor 27. When the circuit of FIG. 5 is connected to the drive device according to the invention in the manner illustrated in FIG. 6, then the gate of the transistor 2 is kept in the DC mode at a voltage level approximately 10 V higher than its source when it is desired to keep the upper transistor 2 switched on.

However, the connection shown in FIG. 6 is disadvantageous for AC operation. Indeed, in this case, the circuit of FIG. 6 responds very slowly, since the charge pump system shown in FIG. 5 has to charge the input capacity of the power MOS transistor 2 (of the order of 1 nF), while the capacity of the pump is approximately 100 pF. Consequently, such a system is not capable of operating at high switching frequencies (100–200 kHz), as is required by present switching systems.

Figure 7:
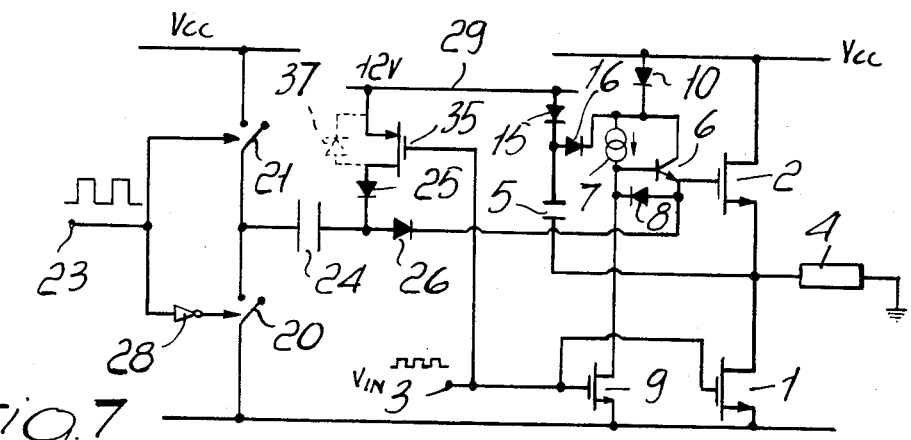
FIG. 7 is the equivalent electric diagram of a composite embodiment of the device according to the invention.

In order to solve this disadvantage, the charge circuit according to FIG. 5 is connected according to the invention in the manner illustrated in FIG. 7.

FIG. 7 therefore illustrates the drive circuit according to the invention in its complete embodiment, intended for DC and AC operation, comprising the bootstrap system which ensures a reliable and low-dissipation AC operation, as well as the charge pump of FIG. 5 which ensures a low-dissipation DC operation.

As can be noted, the circuit of FIG. 7 is the combination of the circuit of FIG. 4 and of the charge pump of FIG. 5, in which the common elements have been assigned the same reference numerals. It should be noted, however, that the capacitor 27 of FIG. 5 has been neglected in FIG. 7 since the gate capacity of the transistor 2 has the same function and it is exactly the capacitance which must be charged to the desired DC voltage. Substantially, therefore, the circuit of FIG. 5 has been connected to the one of FIG. 4 through a transistor 35, operating as a switch placed between the anode of the diode 25 and the lower-level constant voltage line 29 (for example at 12 V). In the drawing, the parasitic diode 37 has also been shown, which is formed between the source and the drain of the transistor 35.

The operation of the device according to FIG. 7 will only be described with reference to the DC operation as far as the charge pump is concerned, the AC operation being entirely similar to the one of FIG. 4.

When the power transistor 2 has to be DC controlled, the signal fed on the input 3 is such as to keep the transistor 9 (operating as a switch) switched off, while the transistor 35 is kept switched on. In this way, when the switch 20 is closed, the capacitor 24 is charged through the diode 25 at the voltage present on the line 29 (12 V), while, when the switch 20 opens and the switch 21 is closed, the capacitor 24 transfers its charge to the gate capacitance of the power transistor 2 through the diode 26. In this condition, the diode 25 de-couples the capacitor 24 from the switch 35, thus preventing the parasitic diode 37 in parallel to the transistor 35 from simultaneously switching on. In this way, the connection is obtained between the charge pump circuit and the driving circuit according to FIG. 4 with DC operation, while in AC operation, since the switch 35 is controlled in opposite phase to the switch 9, the transistor 35 itself de-couples the diode 25 from the supply line 29 and therefore inactivates the charge pump.

Therefore, as explained, the circuit of FIG. 4 has a reliable behavior both in DC and AC modes, allowing for the driving of a load in any situation. Such a circuit, completed in the manner described in FIG. 7, furthermore allows also for a low-dissipation DC operation.

Furthermore, it should be pointed out that the two diodes 10 and 16, which are a fundamental part of the bootstrap circuit and are indispensable for the correct operation of the simplified circuit of FIG. 4, also have the function of de-coupling the driving transistor 2 from the DC supply $V_{CC}$ and from the lower voltage supply (at 12 V) when the gate of the transistor 2 becomes high during DC operation.

An important feature of the invention is represented by the fact that when the charge pump is operating, the required charge condition is achieved rather quickly since, by virtue of the diode 10 connected to the supply voltage, the gate capacitance of the transistor 2 charges at $V_{CC}$ and the charge pump is only requested to supply the voltage existing on the line 29, that is to say approximately 12 V. In this way, fast transients are achieved for passing from AC to DC operating mode.

It should be noted that the separation of the diode 25 from the 12 V supply upon switching on of the transistor or switch 9 and therefore upon switching off of the transistor 35, prevents the diodes 25, 26 and 8 from being series coupled between the 12 V supply and the ground during the switching-on periods of the switch 9.

The invention thus conceived is susceptible of several modifications and variations, without departing from the inventive scope. In particular, all the elements may be replaced by other technically equivalent ones.

We claim:

1. A driving circuit for power MOS transistors of pushpull stages, comprising:
    a first reference potential line,
    a second reference potential line, different from said first reference potential line,
    an AC signal input receiving an input AC signal having a first and a second level,
    first and second power MOS transistors, said power MOS transistors having each drain, source and gate terminals, being connected in a push-pull configuration and defining an upper a lower MOS transistors, said gate terminals of said power MOS transistor being connected to said AC signal input, said drain terminal of said upper MOS transistor being connected to said first reference potential line,
    a bootstrap circuit having a bootstrap capacitor connected between said source terminal of said upper MOS transistor and said second reference potential line,
    a first switch element connected between said bootstrap capacitor and said second reference potential line, said first switch element and said capacitor defining a common point,
    a second switch element arranged between said first reference potential line and said gate terminal of said upper MOS transistor,
    a third switch element arranged between said gate terminal of said upper MOS transistor and said common point,
said second switch element being closed and said first and third switch elements being open during DC operation, thereby allowing electrical connection of said gate terminal of said upper MOS transistor to said first reference potential line, said first and second switch elements being closed and said third switch element being open during AC operation with said input AC signal at said first level thereby said capacitor charging at the voltage of said second reference potential line, said first and second switch elements being open and said third switch element being closed during AC operation with said input AC signal at said second level, thereby said capacitor being parallel connected between said gate and source terminals of said upper MOS transistor.

2. A driving circuit for power MOS transistors of push-pull stages, comprising:
   a first reference potential line,
   a second reference potential line, at a lower voltage than said first reference potential line,
   an AC signal input receiving an input AC signal having a first and a second level,
   first and second power MOS transistors, said power MOS transistors having each drain, source and gate terminals, being connected in a push-pull configuration and defining an upper and a lower MOS transistors, said gate terminals of said power MOS transistor being connected to said AC signal input, said drain terminal of said upper MOS transistor being connected to said first reference potential line,
   a bootstrap circuit having a bootstrap capacitor connected between said source terminal of said upper MOS transistor and said second reference potential line,
   a first switch element connected between said bootstrap capacitor and said second reference potential line, said first switch element and said capacitor defining a common point,
   a second switch element arranged between said first reference potential line and said gate terminal of said upper MOS transistor,
   a third switch element arranged between said gate terminal of said upper MOS transistor and said common point,
   said second switch element being closed and said first and third switch elements being open during DC operation, thereby allowing electrical connection of said gate terminal of said upper MOS transistor to said first reference potential line, said first and second switch elements being closed and said third switch element being open during AC operation with said input AC signal at said first level thereby said capacitor charging at the voltage of said second reference potential line, said first and second switch elements being open and said third switch element being closed during AC operation with said input AC signal at said second level, thereby said capacitor being parallel connected between said gate and source terminals of said upper MOS transistor.

3. A driving circuit for power MOS transistors of push-pull stages, comprising:
   a first reference potential line,
   a second reference potential line, at a lower voltage than said first reference potential line,
   a third reference potential line, at a lower voltage than said second reference potential line,
   an AC signal input receiving an AC input signal having a first and a second level,
   first and second power MOS transistors, said power MOS transistors having each drain, source and gate terminals, said first power MOS transistor having said drain terminal thereof connected to said first reference potential line, said source terminal connected to said drain terminal of said second power MOS transistor, said second power MOS transistor having said source terminal thereof connected to said third reference potential line, said first and second power MOS transistors having said gate terminals thereof selectively and alternatively connected to said AC signal input and defining an upper and a lower MOS transistors, respectively,
   a bootstrap circuit having a bootstrap capacitor connected between said source terminal of said upper MOS transistor and said second reference potential line,
   a first switch element connected between said bootstrap capacitor and said second reference potential line, said first switch element and said capacitor defining a common point,
   a second switch element arranged between said first reference potential line and said gate terminal of said upper MOS transistor,
   a third switch element arranged between said gate terminal of said upper MOS transistor and said common point,
   said second switch element being closed and said first and third switch elements being open during DC operation, thereby allowing electrical connection of said gate terminal of said upper MOS transistor to said first reference potential line, said first and second switch elements being closed and said third switch element being open during AC operation with said input AC signal at said first level thereby said capacitor charging at the voltage of said second reference potential line, said first and second switch elements being open and said third switch element being closed during AC operation with said input AC signal at said second level, thereby said capacitor being parallel connected between said gate and source terminals of said upper MOS transistor.

4. A circuit according to claim 1, wherein said switch elements are constituted by diodes.

5. A circuit according to claim 3, wherein said switch elements comprise diodes having each an anode and a cathode electrode, said first switch element including a first diode having its anode electrode connected to said second reference potential line and its cathode connected to said common point, said second switch element including a second diode having its anode electrode connected to said first reference potential line and its cathode electrode connected to said gate terminal of said upper MOS transistor, and said third switching element including a third diode having its anode electrode connected to said common point and its cathode electrode connected to said gate terminal of said upper MOS transistor.

6. A circuit according to claim 1, further comprising a charge pump section (FIG. 5) including a further capacitor connected with a first terminal thereof to a further reference potential line through a fourth switch element and with a second terminal thereof to a switching section alternately connecting said further capacitor to said first reference potential and to ground, said first terminal of said further capacitor being furthermore connected to said gate terminal of said upper MOS transistor, said fourth switch element comprising a switching MOS transistor controlled on the gate terminal thereof by a signal in antiphase relatively to said input AC signal.

7. A circuit according to claim 1, further comprising a charge pump section including a further capacitor connected with a first terminal thereof to a further reference potential line and to said gate terminal of said upper MOS transistor and with a second terminal thereof to a switching section alternately connecting said further capacitor to said first reference potential line and ground, wherein said second reference voltage line and said further reference voltage line have the same potential.

8. A circuit according to claim 6, wherein said first terminal of said further capacitor is connected to said gate terminal of said upper MOS transistor through a fifth switch element.

9. A circuit according to claim 8, wherein said fifth switch element is a diode having its anode electrode connected to said further capacitor and its cathode electrode connected to said gate terminal.

10. A circuit according to claim 6, wherein said fourth switch element further comprises a diode having its anode connected to said switching MOS transistor and its cathode connected to said first terminal.

* * * * *